United States Patent
Nakazawa et al.

(10) Patent No.: US 6,274,805 B1
(45) Date of Patent: Aug. 14, 2001

(54) SOLAR CELL AND MANUFACTURING METHOD THEREOF

(75) Inventors: Hidenobu Nakazawa; Takayuki Watanabe, both of Fuji (JP)

(73) Assignee: Asahi Kasei Kabushiki Kaisha (JP)

( * ) Notice: Subject to any disclaimer, the term of this patent is extended or adjusted under 35 U.S.C. 154(b) by 0 days.

(21) Appl. No.: 09/423,328

(22) PCT Filed: Apr. 30, 1998

(86) PCT No.: PCT/JP98/01994

§ 371 Date: Nov. 5, 1999

§ 102(e) Date: Nov. 5, 1999

(87) PCT Pub. No.: WO98/50962

PCT Pub. Date: Nov. 12, 1998

(30) Foreign Application Priority Data

May 7, 1997 (JP) .................................... 9-116918
Mar. 20, 1998 (JP) .................................. 10-072347

(51) Int. Cl.⁷ .................................................. H01L 31/00
(52) U.S. Cl. ................................................... 136/256
(58) Field of Search .............................................. 136/256

(56) References Cited

FOREIGN PATENT DOCUMENTS

| | | |
|---|---|---|
| 641030 A2 | 3/1995 | (EP) . |
| 0778308 A1 | 6/1997 | (EP) . |
| 1-309385 | 12/1989 | (JP) . |
| 5-259494 | 10/1993 | (JP) . |
| 6-204541 | 7/1994 | (JP) . |
| 6-214936 | 8/1994 | (JP) . |
| 7-122770 | 5/1995 | (JP) . |
| 7-302926 | 11/1995 | (JP) . |
| WO 96/06128 | 2/1996 | (WO) . |

OTHER PUBLICATIONS

Solar Energy Materials and Solar Cells 29 (1993) 163–173.

Solar Energy Materials and Solar Cells 29 (1996) 93–98.

*Primary Examiner*—Mark Chapman
(74) *Attorney, Agent, or Firm*—Pennie & Edmonds LLP

(57) ABSTRACT

A solar cell having a semiconductor layer of a chalcopyrite structure as a light absorption layer and using a flexible film as a substrate, breakdown and peeling caused to the semiconductor layer of the chalcopyrite structure due to warp of the flexible film upon heat treatment is prevented. To realize this, a poly(phenylene terephthalmide) film having a coefficient of heat expansion of $5.0 \times 10^{-6}/°$ C. is used as a substrate (1). After a Ti reinforcing layer (6) is disposed on the entire back surface of this substrate (1), a first electrode layer (2) is disposed on the front surface of this substrate (1), and a p-type semiconductor layer (3) of a chalcopyrite structure is formed as a light absorption layer on the surface of the first electrode layer (2).

11 Claims, 2 Drawing Sheets

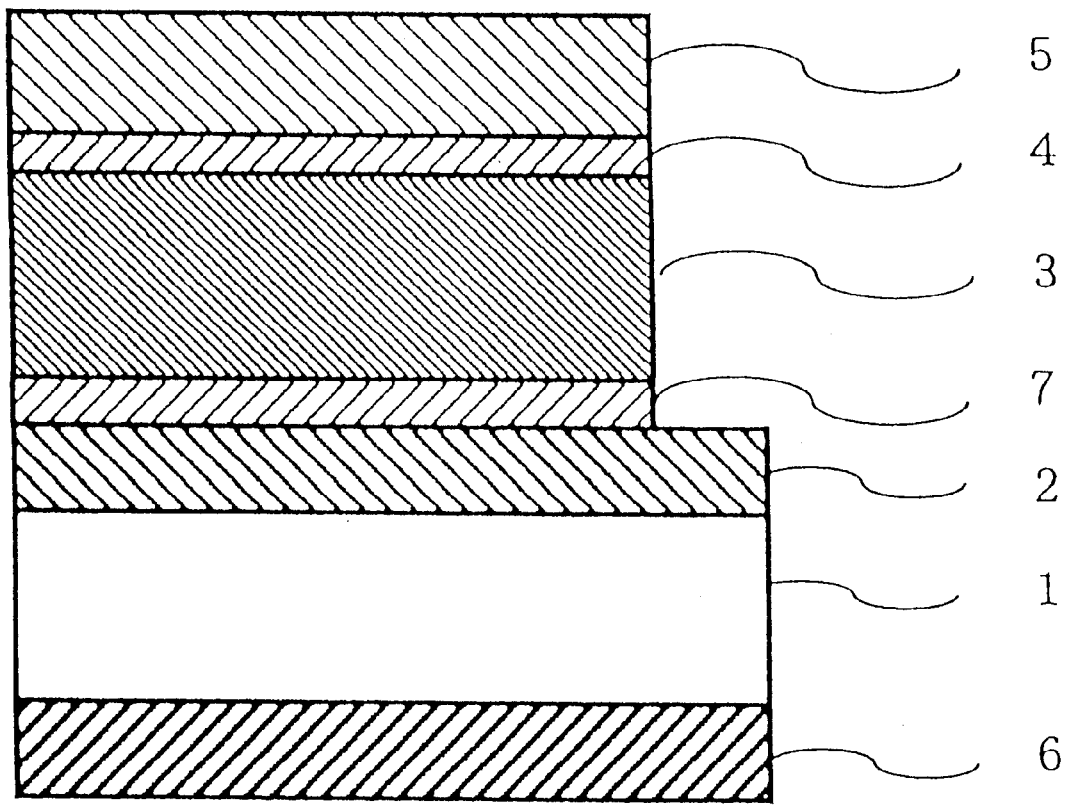
F I G. 3

SOLAR CELL AND MANUFACTURING METHOD THEREOF

TECHNICAL FIELD

The present invention concerns a solar cell having a semiconductor layer of a chalcopyrite structure as a light absorption layer on a flexible film and, more in particular, it relates to a solar cell using a specific heat resistant polymeric film as a substrate.

BACKGROUND ART

Solar cells having amorphous silicon as a light absorption layer (amorphous silicon solar cell) have been expected as s solar cell capable of lowering the cost, which have been already put to a practical stage partially. Japanese Published Unexamined Application Hei 1-309385 discloses an amorphous silicon solar cell using a flexible film as a substrate. The solar cell has an advantageous feature, compared with existent solar cells of using glass substrate, capable of providing optional curvature by the form of the film, capable of being carried about easily by its light weight, and capable of extending application ranges.

However, since amorphous silicon involves a problem that the performance is degraded when exposed to sunlight, and a single layer amorphous silicon solar cell capable of attaining a reduced cost has a conversion efficiency of only about 6% at the highest when it is formed on a film.

On the contrary, solar cells having a semiconductor layer of a chalcopyrite structure such as $Cu(In,Ga)Se_2$ as a light absorption layer have been noted as the solar cells of high conversion efficiency, and research and development have been conducted vigorously for such solar cells. The layer constitution of the solar cell can include the structure, as shown in FIG. 1, in which a first electrode layer 2 comprising a thin film such as made of molybdenum, a p-type semiconductor layer 3 of a chalcopyrite structure, an n-type semiconductor layer 4 comprising CdS or the like and a second electrode layer comprising a thin film such as of ITO (indium/tin oxide) on a substrate 1.

Then, Solar Energy Materials and Solar Cells, 29, 1993) 163–173 discloses a solar cell having a $CuInSe_2$ layer as a light absorption layer, and using a sheet of a simple noble metal such as molybdenum or titanium as a substrate. While the solar cell has a merit of being reduced in weight and having somewhat higher degree of freedom of the shape compared with the cell of using the glass substrate, it is difficult to be put into practical use since the cost for the sheet of the simple noble metal is high.

Solar Energy Materials and Solar Cells, 43 (1996) 93–98 discloses a solar cell having a $CuInSe_2$ layer as a light absorption layer and using a polyimide film as a substrate. In this case, when the $CuInSe_2$ layer is formed, it is necessary to apply a heat treatment in a hydrogen selenide atmosphere at a high temperature (400 to 600° C.) for obtaining a film of good crystallinity. In the amorphous solar cell, such a heat treatment is not conducted. In the heat treatment described above, the polyimide film suffers from warp or degradation caused by hydrogen selenide. As a result, for example, break-down caused to the $CuInSe_2$ layer, peeling of the $CuInSe_2$ layer from the molybdenum electrode or peeling of the molybdenum electrode layer from the surface of the film. So the conversion efficiency of the solar cell is lowered.

Japanese Patent Laid-Open Publication No. Hei 5-259494 discloses a solar cell having a semiconductor layer of a chalcopyrite structure as a light absorption layer, and using a polyimide film, a polyethylene tetrafluoride film, or a copolymer film of ethylene tetrafluoride and propylene hexafluoride as a substrate. Further, it discloses a method of decreasing thermal injuries to the film by applying laser annealing to the semiconductor layer of the chalcopyrite structure in a state of keeping the substrate comprising the polymeric film described above at a temperature not higher than 0° C.

However, since it is necessary to use a great amount of liquid nitrogen as a coolant for keeping the film at a temperature not higher than the 0° C., it can not be said that the method is practical since the production cost is increased.

It is a subject of the present invention to provide a solar cell having a semiconductor layer of a chalcopyrite structure as a light absorption layer and using a flexible film as a substrate, having reduced weight, a high degree of freedom for the shape and capable of suppressing the production cost while keeping a high conversion efficiency, by preventing break-down or peeling caused to the semiconductor layer of the chalcopyrite structure owing to warp caused to the flexible film upon heat treatment or during use.

DISCLOSURE OF THE INVENTION

The present invention provides a solar cell in which a semiconductor layer of a chalcopyrite structure is disposed as a light absorbing layer on the front surface of a substrate comprising a flexible film having an average value of a linear expansion coefficient in the range of 30° C. to 300° C. (hereinafter simply referred to as "linear expansion coefficient") of from $1 \times 10^{-6}$/° C. to $10 \times 10^{-6}$/° C.

The linear expansion coefficient of the semiconductor layer of the chalcopyrite structure is about $9 \times 10^{-6}$/° C. to $10 \times 10^{-6°}$ C. and, since the linear expansion coefficient of the flexible film as the substrate is substantially the same as that of the semiconductor of the chalcopyrite structure for the solar cell of the present invention, break-down and peeling less occur to the semiconductor layer of the chalcopyrite structure upon heat treatment in the step of forming the semiconductor layer of the chalcopyrite structure, upon fabrication of a film-like solar cell into a predetermined shape after completion of the lamination for each of layers and during use as a solar cell.

In the solar cell of the present invention, the flexible film as the substrate (hereinafter simply referred to as "film" or "substrate") preferably has a tensile strength of from 20 $kg/mm^2$ to 80 $kg/mm^2$, and an modulus of elasticity in an optional direction in parallel with the film surface of from 1,000 $kg/mm^2$ to 2500 $kg/mm^2$ and an elongation at break in an optional direction in parallel with the film surface of 5% or more.

When the substrate has a tensile strength of from 20 $kg/mm^2$ to 80 $kg/mm^2$ and a modulus of elasticity in an optional direction in parallel with the film surface of from 1,000 $kg/mm^2$ to 2500 $kg/mm^2$, deformation and rupture of the substrate and the break-down of the semiconductor layer of the chalcopyrite structure can be prevented upon fabrication of a film-like the solar cell into a predetermined shape or upon handling during use as a solar cell. When the modulus of elasticity exceeds 2500 $kg/mm^2$, the tearing strength is degraded to result in a problem upon fabrication. The modulus of elasticity is preferably from 1200 $kg/mm^2$ to 2500 $kg/mm^2$ and, particularly preferably, the modulus of elasticity is 1300 $kg/mm^2$ or more at least in one direction.

When the elongation at break in an optional direction in parallel with the film surface is 5% or more, the workability is improved. Films having the elongation at break of less than 5% are fragile and difficult to handle with. It is particularly preferred that the elongation at break is 10% or more.

In the solar cell of the present invention, the density of the flexible film as the substrate is preferably from 1.39 to 1.54 g/cm$^3$. Since such a film having a relatively high density has excellent dimensional stability, for example, to the change of temperature and humidity, it has high characteristics as a solar cell. In addition, satisfactory characteristics as the solar cell can be kept for a long period of time with less change. The density of the flexible film can be measured, for example, by a so-called density-gradient tube method using a solvent mixture of carbon tetrachloride and toluene kept at 25° C. When the density of the aromatic polyamide film used in the embodiment of the present invention was measured, it was from 1.40 to 1.45 g/cm$^3$.

In the solar cell of the present invention, the thickness of the flexible film as a substrate is not particularly limited, and it may be from 5 μm to 150 μm and, preferably, from 12 μm to 100 μm.

The flexible film as the substrate of the solar cell of the present invention may contain fine particles. The fine particles to be contained in the flexible film can include those of organic or inorganic compounds, and inorganic compounds such as SiO$_2$, TiO$_2$, Al$_2$O$_3$, CaSO$_4$, BaSO$_4$ and CaCO$_3$ can be generally used. More preferably, inorganic oxide series fine particles such as SiO$_2$, TiO$_2$ and Al$_2$O$_3$ which are insoluble to solvents such as organic solvents and inorganic acids and less coagulated in such solvents are used. Such fine particles may be contained in the film only by one kind or two or more kinds of them.

As the shape of the fine particles, those of a spherical shape having a small specific surface area are preferred since they less tended to be coagulated. The ratio of the major diameter to the minor diameter (major diameter/minor diameter) is preferably 3 or less and, more preferably, 1.5 or less. The size of the fine particles is not particularly limited since it is determined depending on the proportion contained in the film, but the average primary particle diameter of the fine particle to be used usually is from 0.005 to 0.3 μm. With respect to the shape and the size of the fine particles, they may be used alone or two or more of them may be used in admixture.

In the solar cell of the present invention, the plastic film as the substrate may be any of flexible films so long as they are flexible polymeric films with a linear expansion coefficient of from 1×10$^{-6}$/° C. to 10×10$^{-6}$/° C., including, for example, films made of polyimide, polyethylene terephthalate, polyethylene naphthalate, polyether sulfone, polyvinyl fluoride and aromatic polyamides. Among them, since the aromatic polyamide films have excellent mechanical strength such as tensile strength, modulus of elasticity and elongation at break, and, excellent thermal dimensional stability, they are easily handlable and accordingly, preferred as the substrate for the solar cell.

Among the aromatic polyamide films, those made of para-orientation type aromatic polyamide have especially excellent mechanical strength such as tensile strength, modulus of elasticity and elongation at break, and thermal dimensional stability, so that they are more preferred as the substrate for the solar cell of the present invention.

The molecular structure of the para-orientation aromatic polyamide comprises a combination of the following constitutional units (1) to (3). The unit (3) can constitute the structure by itself. When the molecular structure is constituted by the combination of the constitutional units of (1) to (3), Ar1 to Ar3 may be identical or different.

—NH—Ar1—NH— (1)

—CO—Ar2—CO— (2)

—NH—Ar3—CO— (3)

In this case, Ar1, Ar2 and Ar3 each represents a para-orientation bivalent group containing at least one aromatic ring, and the typical example includes those represented by any of the following general formulae as shown below. In this context, the para-orientation type means that the bonding direction of the main chain in the aromatic ring situates at para-positions, or the bonding direction of the main chain on both ends are coaxial or in parallel in residues comprising two or more aromatic rings.

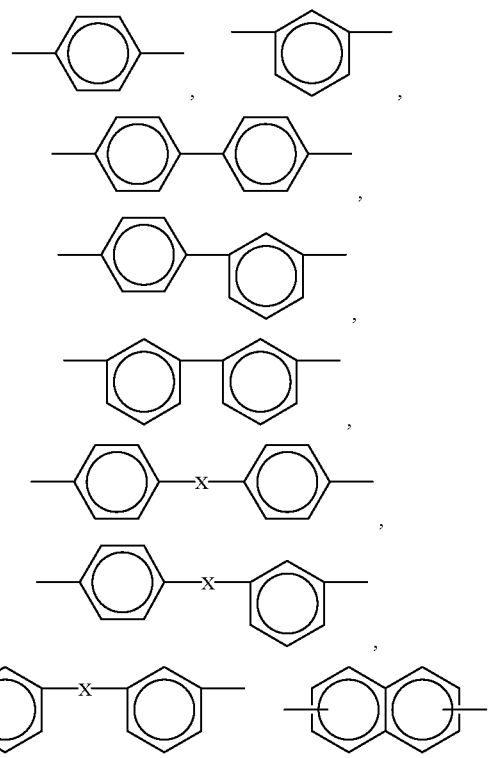

A portion of hydrogen on the aromatic ring in the general formulae may be substituted, for example, with halogen groups, nitro groups, alkyl groups or alkoxy groups. X represents, for example, —O—, —CH$_2$—, —SO$_2$—, —S— and —CO—.

In particular, films comprising a para-orientation type aromatic polyadmide in which 80 mol % or more of all aromatic rings are bonded at para-positions are preferred as the substrate of the solar cell of the present invention. In addition, those in which a portion of hydrogen on the aromatic ring is substituted with halogen (particularly, chlorine) are effective for the improvement of moisture absorption rate, improvement of dimensional stability upon moisture adsorption and improvement of moldability of the film.

The para-orientation type aromatic polyamide suitable to the substrate material of the present invention may be copolymerized with 30 mol % or less of constitutional units other than (1) to (3) described above or blended with a small amount of other polymers for the purpose of improving the moldability.

Particularly preferred materials of the flexible film as the substrate of the solar cell of the present invention are poly(paraphenylene terephthalamide) and chloro-substituted poly(paraphenylene terephthalamide) or copolymers or blend polymers containing 70 mol % or more of chloro-substituted poly(paraphenylene terephthalamide).

The aromatic polyamide film as the substrate of the solar cell of the present invention may contain additives such as fillers, delusterants, UV stabilizers, heat stabilizers, antioxidants, pigments and solution auxiliaries within such a range as the linear expansion coefficient is not out of the range of the present invention, or favarable characteristics of the aromatic polyamide films are not deteriorated.

The flexible film as the substrate of the solar cell of the present invention may preferably be formed of a polymer having such a degree of polymerization that the logarithmic viscosity measured by dissolving 0.1 g of the polymer in 150 ml of 98% sulfuric acid at 35° C. is from 2.5 to 8.5 and, more preferably, formed of a polymer having such a degree of polymerization that the logarithmic viscosity is from 3.0 to 7.5. Films formed by using a polymer having a low degree of polymerization have poor mechanical properties, and polymers having excessively high degree of polymerization are not practical.

Further, the present invention provides a solar cell having a semiconductor layer of a chalcopyrite structure as a light absorbing layer on the front surface of a substrate comprising a flexible film, in which a thin film having an average value of a linear expansion coefficient in the range of 30° C. to 300° C. (hereinafter simply referred to as "linear expansion coefficient") of from $3\times10^{-6}/°$ C. to $20\times10^{-6°}$ C. is disposed as a reinforcing layer on the back surface of the substrate.

While the linear expansion coefficient of the chalcopyrite structure is about $9\times10^{-6}/°$ C. to $10\times10^{-6}/°$ C., the semiconductor layer of the chalcopyrite structure is less broken or peeled upon fabrication for forming a film-like solar cell into a predetermined shape after completion of the lamination of each layer or during use since a reinforcing layer having a linear expansion coefficient substantially identical with that of the semiconductor of the chalcopyrite structure is disposed on the back surface of the flexible film as the substrate in the solar cell of the present invention.

In the production process of the solar cell of the present invention, it is preferred to conduct a step of forming the semiconductor layer of the chalcopyrite structure on the front surface of the substrate comprising the flexible film after the step of forming the reinforcing layer on the back surface of the substrate. According to this method, since the step of forming the semiconductor layer of the chalcopyrite structure is conducted in a state where the reinforcing layer is formed on the back surface of the substrate, the flexible film as the substrate is less warped upon heat treatment in the step of forming the semiconductor layer of the chalcopyrite structure. Therefore, peeling or partial break-down of the semiconductor layer of the chalcopyrite structure can be prevented during manufacture of the solar cell.

The reinforcing layer preferably comprises a thin film of Ta, Ti, Mo, Ni or Co, or a mixed composition containing at least any one of the elements. These thin films have an average value of linear expansion coefficient in the range of 30° C. to 300° C. of from $3\times10^{-6}/°$ C. to $20\times10^{-6}/°$ C. and have high corrosion resistance in a hydrogen selenide atmosphere or hydrogen sulfide atmosphere. Accordingly, an effect of suppressing denaturation of the flexible film as the substrate can also be expected by forming such a thin film as a reinforcing layer. In addition, the thin film of the mixed composition can include those thin films comprising alloys or oxides and nitrides (for example, $TiO_2$, and $TiN_x$) of each of the elements.

The linear coexpansion coefficients of the metal films comprising each of the elements are shown in Table 1.

The film thickness of the reinforcing layer is preferably from 0.5 to 5 times that the film thickness of the semiconductor layer of the chalcopyrite structure and, more preferably, from 1.5 times to 3 times. The linear expansion coefficient of the thin film of the reinforcing layer is more preferably from $8\times10^{-6}/°$ C. to $16\times10^{-6}/°$ C.

It is preferred that the solar cell of the present invention has a thin film of Te, Sn, Ti, Ta or Cr, or a mixed composition containing at least one of the elements, as a bonding layer, between the electrode layer formed on the front surface of the substrate and the semiconductor layer of the chalcopyrite structure.

Since the thin film has a linear expansion coefficient substantially identical with that of the semiconductor layer of the chalcopyrite structure, or has a high wettability relative to the semiconductor layer of the chalcopyrite structure, the bonding force between the electrode layer and the semiconductor layer of the chalcopyrite structure is increased upon heat treatment at high temperatures by the presence of such a thin film. The thickness of the thin film as the bonding layer is preferably from 0.01 $\mu$m to 0.1 $\mu$m.

Even in a solar cell having a reinforcing layer, the linear expansion coefficient of the flexible film as the substrate is, preferably, from $1\times10^{-6}/°$ C. to $10\times10^{-6}/°$ C. and, more preferably, from $1\times10^{-6}/°$ C. to $8\times10^{-6}/°$ C. When the linear expansion coefficient of the flexible film as the substrate is too large, or the linear expansion coefficient is negative, the effect of suppressing the warp of the film upon heat treatment can not be obtained sufficiently even if the reinforcing layer is disposed.

A particularly preferred constitution of the solar cell of the present invention is to use an aromatic polyamide film having a linear expansion coefficient of from $1\times10^{-6}/°$ C. to $8\times10^{-6}/°$ C. as a substrate, use a semiconductor layer of the chalcopyrite structure having a linear expansion coefficient of from $9\times10^{-6}/°$ C. to $10\times10^{-6}/°$ C. and dispose a thin film having a linear expansion coefficient of from $8\times10^{-6}/°$ C. to $16\times10^{-6}/°$ C. as a reinforcing layer. With such a constitution, the warp of the film as the substrate can be suppressed upon heat treatment, thereby providing a particularly great effect of preventing peeling and break-down of the semiconductor layer of the chalcopyrite structure.

In this context, the semiconductor of the chalcopyrite structure is a collective name for compounds of the chalcopyrite type structure comprising metals belonging to the group Ib of the periodical table such as Cu and Ag, metals belonging to the group IIIb of the periodical table such as Ga and In, and chalcogen elements such as S, Se and Te, and they include many kinds. Among them, $CuInS_2$, $CuInSe_2$, $CuGaSe_2$ or solid solution thereof have appropriate band gaps and are preferred as materials for solar cells.

In the solar cell of the present invention, the semiconductor layer of the chalcopyrite structure as a light absorbing layer is preferably a p-type semiconductor layer containing p-type impurities and n-type impurities. Among semiconductors of the chalcopyrite structure, $CuInS_2$, for instance, having strong ionic bond has a problem that even when a great amount of p-type impurities are doped, a p-type semiconductor of a carrier concentration corresponding to the high doping amount can hardly be obtained. This problem can be overcome by doping not only the p-type impurities but also n-type impurities together to obtain a p-type semiconductor. An international application has already been filed by the applicant of the present invention for the technique of obtaining a p-type semiconductor of the chalcopyrite structure having high carrier concentration.

The p-type impurities for the semiconductor of the chalcopyrite structure can include elements belonging to the group IIa and/or the group Vb and the n-type impurities therefor can include elements belonging to the group IVb and/or the group VIIb.

The semiconductor layer of the chalcopyrite structure as the light absorbing layer of the solar cell of the present invention may also contain elements belonging to the group Ia such as Li, K and Na. Incorporation of such elements can provide effects of increasing the crystallinity of the semiconductor layer of the chalcopyrite structure and improving the conversion efficiency of the solar cell.

As the method of forming the semiconductor layer of the chalcopyrite structure, any of known methods can be adopted, for example, a sputtering method, an ohmic heat-vapor deposition method, an electron beam vapor deposition method, a molecular beam epitaxy method, a chemical vapor deposition method, a spray decomposition method, an electrolysis method, an electroless plating method, a chemical bath deposition (CBD) method and a coating method. If necessary, a heat treatment may be conducted in a gas containing sulfur or selenium.

The structure of the solar cell of the present invention can include a structure, as shown in FIG. 1, of using a flexible film as a substrate 1, disposing a first electrode layer 2 on at least a portion of the surface, disposing a p-type semiconductor layer 3 of a chalcopyrite structure partially or entirely on the surface of the first electrode layer 2, disposing an n-type semiconductor layer 4 further thereover, and disposing a second electrode layer 5 to at least a portion on the surface of the n-type semiconductor layer 4. In addition, as shown in FIG. 2, there is also a structure having a reinforcing layer 6 on the entire back surface of the substrate 1 comprising a flexible film in addition to each of the layers in FIG. 1.

The solar cell has an opto-electric conversion function by the pn junction of the p-type semiconductor layer 3 of the chalcopyrite structure and an n-type semiconductor layer 4. The pn junction includes a homo-junction structure in which materials of the same crystalline structure are used for the p-type semiconductor and the n-type semiconductor and a hetero-junction structure in which materials of different crystalline structure is used for the p-type semiconductor and the n-type semiconductor. Compound semiconductors such as semiconductors of the chalcopyrite structure, cadmium sulfide, zinc sulfide, zinc selenide, zinc oxide, tin oxide, zirconium oxide and indium hydroxide can be used as the n-type semiconductor.

As the method of forming the pn junction, any of known methods can be adopted, for example, a sputtering method, an evaporation method, an electron beam evaporation method, a molecular beam epitaxy method, a chemical vapor deposition method, a spray decomposition method, an electrolysis method, an electroless plating method, a chemical bath deposition (CBD) method and a coating method. If necessary, a heat treatment can be conducted in an appropriate gas atmosphere after forming the pn junction.

Any material can be used as the material for the first electrode layer 2 so long as it is electroconductive, and a material of excellent corrosion resistance and heat resistance such as molybdenum is preferably used. As the material for the second electrode layer 5, a transparent electrode material such as ITO (indium/tin oxide) and zinc oxide are preferably used for allowing incident light and emission light to permeate therethrough.

BRIEF DESCRIPTION OF THE DRAWINGS

FIG. 3 is a schematic cross sectional view showing a laminate structure of a solar cell of the present invention prepared in Examples 7 and 10.

BEST MODE FOR PRACTICING THE INVENTION

Figure 1:
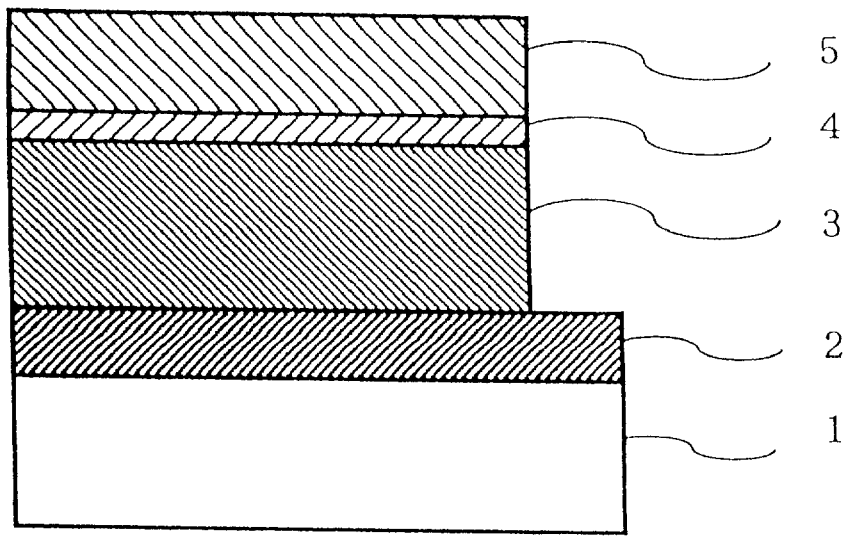
FIG. 1 is a schematic cross sectional view showing a laminate structure of an existent solar cell and a solar cell of the present invention, which is prepared in Examples 2, 4 and 6.

Explanations will be made for the embodiments of the present invention with reference to concrete examples.

In the examples described below, the thickness of the film as the substrate was measured by using a dial gage having a measuring surface with a diameter of 2 mm. Tensile strength and elongation at break were measured by using a constant extension rate type strength and elongation measuring instrument DDS-500 manufactured by Shimazu Seisakusho Co. Ltd. under the conditions with a measuring length of 100 mm and at a tensile speed of 50 mm/min. Modulus elasticity was calculated within a range of elongation from 0.05 to 0.25% based on a stress-strain curve determined by the measurement for the tensile strength by using the measuring instrument described above.

The linear expansion coefficient of the film as the substrate was measured as described below. At first, a sample cut into a width of 5.0 mm and a length of 25.0 mm was attached to a TM 7000 type thermodynamic property measuring instrument manufactured by Shinku Riko Co. Ltd., and the temperature was elevated from a room temperature to 300° C. at a condition under the load of 0.3 g or less to remove residual strains of the sample. Subsequently, the dimensions A1 and B1 in the lateral and longitudinal directions of the samples were measured at 300° C.

Then, the sample was cooled from 300° C. to 30° C. in a nitrogen stream. Subsequently, the dimensions A2 and B2 in the lateral and longitudinal directions were measured at 30° C.

Next, the dimension variation coefficient in the lateral direction ((A1−A2)/A2) was divided by a temperature change 270 to calculate an average value of the linear expansion coefficient in the range of 30° C. to 300° C. in the lateral direction. In the same manner, the average value of the linear expansion coefficients in the range of 30° C. to 300° C. in the longitudinal direction is calculated, to determine the average value of both of them as a linear expansion coefficient.

EXAMPLE 1

As a substrate, a polyparaphenylene terephthalamide (PPTA) film of 50 $\mu$m thickness having a modulus of elasticity of 1200 kg/mm$^2$, a strength of 35 kg/mm$^2$, an elongation at break of 40% and a linear expansion coefficient of $5.0 \times 10^{-6}$/° C. was provided. The film contains silica particles with an average primary particle size of 0.05 $\mu$m (spherical shape at a major diameter/minor diameter ratio of about 1.2) are contained as micro-particles at a ratio of 0.05% by weight based on PPTA.

At first, a titanium layer of 3.5 μm thickness was formed on one surface (back surface) of the film by a sputtering method using a titanium target.

Then, a molybdenum layer of 1 μm thickness was formed on the other surface (front surface) of the film formed with the titanium layer by a sputtering method using a molybdenum target.

Then, the PPTA film was attached to a substrate holder in another sputtering apparatus and the inside of a vacuum chamber was evacuated to a vacuum degree of $1 \times 10^{-5}$ Torr or higher. Then, a In (indium) layer was laminated at a thickness of 0.45 μm to the PPTA film on the side of the molybdenum layer by a sputtering method using an In target, with introducing an argon gas into the vacuum chamber. Then, the target was replaced with Cu (copper) and a Cu layer was laminated at a thickness of 0.2 μm on the In layer. The PPTA film was not heated during sputtering of the In layer and the Cu layer.

Then, the PPTA film was attached in a reactor at high temperature, the inside of the reactor was kept at a mixed atmosphere of hydrogen selenide and argon (5% hydrogen selenide), and a heat treatment was applied at 400° C. for a predetermined period of time, to form a p-type $CuInSe_2$ layer on the molybdenum layer of the PPTA film. The thickness of the thus formed $CuInSe_2$ was 2 μm when measured by a step gage.

On the $CuInSe_2$ layer, a CdS layer was formed at a thickness of about 0.08 μm by a chemical bath deposition (CBD) method. On the CdS layer, an ITO (indium/tin oxide) was formed at a thickness of 1 μm by a sputtering method.

Figure 2:
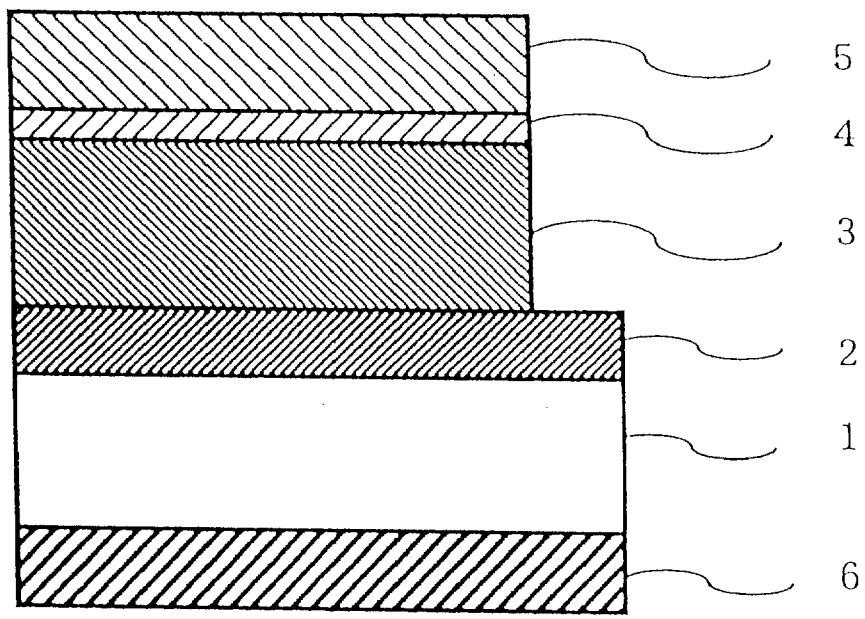
FIG. 2 is a schematic cross sectional view showing a laminate structure of a solar cell of the present invention prepared in Examples 1, 3, 5, 8 and 9.

As described above, a solar cell of a laminate structure having a reinforcing layer 6 comprising a titanium layer over the entire back surface of the substrate 1 comprising a PPTA film and having, on the front surface of the substrate 1, a first electrode layer 2 comprising a molybdenum layer, a p-type semiconductor layer 3 of a chalcopyrite structure comprising a $CuInSe_2$ layer, an n-type semiconductor layer 4 comprising a CdS layer and a second electrode layer 5 comprising a ITO layer in this order as shown in FIG. 2 was manufactured.

The conversion efficiency of the solar cell was 12% when measured by a solar simulator (AM 1.5, 100 mW/cm$^2$). Further, when the laminated state of the solar cell was observed by scanning electron microscopy, while peeling of the $CuInSe_2$ layer from the molybdenum electrode layer (first electrode layer) was observed slightly, peeling of the molybdenum electrode layer from the PPTA film substrate was not observed.

EXAMPLE 2

A solar cell of a laminate structure shown in FIG. 1 was formed by using a substrate 1 comprising the same PPTA film as in Example 1 by the same method as in Example 1 except for not forming the reinforcing layer 6.

The conversion efficiency of the solar cell was 10% when measured by a solar simulator (AM 1.5, 100 mW/cm$^2$). Further, when the laminated state of the solar cell was observed by scanning electron microscopy, while peeling of the $CuInSe_2$ layer from the molybdenum electrode layer was observed, peeling of the molybdenum electrode layer from the PPTA film substrate was not observed. The degree of peeling of the $CuInSe_2$ layer from the molybdenum electrode layer was greater than that in Example 1.

COMPARATIVE EXAMPLE 1

A solar cell of a laminate structure as shown in FIG. 1 was manufactured by the same method as in Example 2 except for using, as a substrate 1, a polyimide layer of 50 μm thickness, having a modulus of elasticity of 400 kg/mm$^2$, a strength of 23 kg/mm$^2$, an elongation at break of 61.5% and a linear expansion coefficient of $21 \times 10^{-6}$/° C.

The conversion efficiency of the solar cell was 6% when measured by a solar simulator (AM 1.5, 100 mW/cm$^2$). Further, when the laminated state of the solar cell was observed by scanning electron microscopy, peeling of the $CuInSe_2$ layer from the molybdenum electrode layer and peeling of the molybdenum electrode layer from the polyimide film substrate were observed.

EXAMPLE 3

A solar cell of a laminate structure as shown in FIG. 2 was manufactured by using a substrate 1 comprising the same PPTA film as in Example 1 by the same method as Example 1 except for changing the thickness of the reinforcing layer comprising a thin titanium layer to 2.5 μm and forming a $CuInS_2$ layer as a semiconductor layer 3 of a chalcopyrite structure as below.

As a step of forming the $CuInS_2$ layer, after forming a molybdenum layer on the PPTA film, at first, the PPTA film was attached in a vacuum reaction vessel, and the inside of the reaction vessel was evacuated to a vacuum degree of $1 \times 10^{-5}$ Torr or higher. Subsequently, an $Na_2S$ layer was formed at a thickness of 50 nm on the molybdenum layer of the PPTA film by an evaporation method.

Then, a gas mixture of $H_2S$+Ar (8% $H_2S$) was introduced into the reaction vessel, and a $CuInS_2$ layer was formed on the $Na_2S$ layer of the PPTA film by conducting reactive sputtering using Cu and In as targets. The substrate (PPTA film) was not heated during sputtering.

Then, the PPTA film was placed in an another reaction vessel and put to a heat treatment at a temperature of 400° C. in an atmosphere of a gas mixture comprising $H_2S$+Ar (5% $H_2S$). By the heat treatment, Na in the $Na_2S$ layer diffuses into the $CuInS_2$ layer. As a result, a highly crystalline p-type $CuInS_2$ layer was formed on the molybdenum layer. Thickness of the thus formed $CuInS_2$ layer was 1.3 μm when measured by a step gage.

The conversion efficiency of the solar cell was 7% when measured by a solar simulator (AM 1.5, 100 mW/cm$^2$). Further, when the laminated state of the solar cell was observed by scanning electron microscopy, while peeling of the $CuInS_2$ layer from the molybdenum electrode layer was observed slightly, peeling of the molybdenum electrode layer from the PPTA substrate was not observed.

EXAMPLE 4

A solar cell of a laminate structure shown in FIG. 1 was manufactured by using the substrate 1 comprising the same PPTA film as in Example 1 by the same method as in Example 3 except for not forming the reinforcing layer.

The conversion efficiency of the solar cell was 4% when measured by a solar simulator (AM 1.5, 100 mW/cm$^2$). Further, when the laminated state of the solar cell was observed by scanning electron microscopy, while peeling of the $CuInS_2$ layer from the molybdenum electrode layer was observed, peeling of the molybdenum electrode layer from the PPTA substrate was not observed. The degree of peeling of the $CuInS_2$ layer from the molybdenum electrode layer was greater than that in Example 3.

EXAMPLE 5

A solar cell of a laminate structure shown in FIG. 2 was manufactured by using a substrate 1 comprising the same PPTA film as in Example 1 by the same method as Example 1 except for changing the thickness of the reinforcing layer made of a thin titanium layer to 2.5 μm and forming a p-type $CuInS_2$ layer containing Sn (n-type impurity) and P (p-type impurity) as a semiconductor layer 3 of a chalcopyrite structure as below.

As the step of forming a $CuInS_2$ layer containing Sn and P, after forming the molybdenum layer on the PPTA film, the PPTA film was at first attached in a vacuum reaction vessel and the inside of the reaction vessel was evacuated to a vacuum degree of $1\times10^{-5}$ Torr or higher. Subsequently, an Sn layer was formed at a thickness of 10 nm on the molybdenum layer by a sputtering method of introducing an argon gas to the reaction vessel and using Sn as a target.

Then, reactive sputtering was conducted by introducing a gas mixture of $H_2S+Ar$ (8% $H_2S$) into the reaction vessel, and using an InP pellet on In and Cu as targets. Thereby a $CuInS_2$ layer containing Sn and P was formed on the molybdenum layer of the PPTA film. The substrate was not heated during sputtering.

Then, the film was placed in an another reaction vessel and put to a heat treatment at a temperature of 400° C. in an atmosphere of a gas mixture comprising $H_2S+Ar$ (5% $H_2S$)

When the concentrations for Sn and P in the thus formed $CuInS_2$ layer were measured by a secondary ion mass spectroanalyzer (IMA-3, manufactured by Hitachi Seisakusho), P was about $1\times10^{19}$ $(cm^{-3})$ and Sn was about $5\times10^{18}$ $(cm^{-3})$. Further, the film thickness of the thus formed $CuInS_2$ layer was 1.3 μm when measured by a step gage.

The conversion efficiency of the solar cell was 10% when measured by a solar simulator (AM 1.5, 100 $mW/cm^2$). Further, when the laminated state of the solar cell was observed by scanning electron microscopy, while peeling of the $CuInS_2$ layer from the molybdenum electrode layer was observed slightly, peeling of the molybdenum electrode layer from the PPTA film substrate was not observed.

EXAMPLE 6

A solar cell of a laminate structure shown in FIG. 1 was manufactured by using a substrate 1 comprising the same PPTA film as in Example 1 by the same method as in Example 5 except for not forming the reinforcing layer.

The conversion efficiency of the solar cell was 7% when measured by a solar simulator (AM 1.5, 100 $mW/cm^2$). Further, when the laminates state of the solar cell was observed by scanning electron microscopy, while peeling of the $CuInS_2$ layer from the molybdenum electrode layer was observed, peeling of the molybdenum electrode layer from the PPTA film substrate was not observed. The degree of peeling of the $CuInS_2$ layer from the molybdenum electrode layer was greater than that in Example 5.

EXAMPLE 7

A substrate 1 comprising the same PPTA film as in Example 1 was used and, after forming a reinforcing layer comprising a thin titanium layer of about 2.5 μm thickness on the back surface of the substrate 1 and a molybdenum layer of 1 μm thickness on the front surface, respectively, in the same manner as in Example 1, a chromium layer of about 0.04 μm thickness was formed on the molybdenum layer by a sputtering method using a chromium target. Subsequently, a $CuInS_2$ layer containing Sn and P was formed by the same method as in Example 5 on the thin chromium layer and then a CdS layer and a ITO layer were formed by the same method as in Example 1.

Thus, a solar cell of a laminate structure having a reinforcing layer 6 comprising a titanium layer on the entire back surface of a substrate comprising a PPTA film and having a first electrode layer 2 comprising a molybdenum layer, a bonding layer 7 comprising a chromium layer, a semiconductor layer 3 of a chalcopyrite structure comprising a p-type $CuInS_2$ containing p-type impurities and n-type impurities, an n-type semiconductor layer 4 comprising a CdS layer and a second electrode layer 5 comprising an ITO layer in this order on the front surface of the substrate 1 was manufactured as shown in FIG. 3.

The conversion efficiency of the solar cell was 11% when measured by a solar simulator (AM 1.5, 100 $mW/cm^2$). Further, when the laminated state of the solar cell was observed by scanning electron microscopy, peeling between the $CuInS_2$ layer and the molybdenum electrode layer was not observed due to the presence of the chromium layer, and peeling of the molybdenum electrode layer from the PPTA substrate was not observed.

EXAMPLE 8

A substrate 1 comprising the same PPTA film as in Example 1 was used, and a molybdenum layer of 3.0 μm thickness was formed as a reinforcing layer 6 on the back surface of the substrate 1 by a sputtering method using a molybdenum target. The solar cell having a laminate structure as shown in FIG. 2 was manufactured by the same method as in Example 1 except for the modification described above.

The conversion efficiency of the solar cell was 12% when measured by a solar simulator (AM 1.5, 100 $mW/cm^2$). Further, when the laminated state of the solar cell was observed by scanning electron microscopy, while peeling of the $CuInSe_2$ layer from the molybdenum electrode layer was observed slightly, peeling of the molybdenum electrode layer from the PPTA film substrate was not observed.

EXAMPLE 9

A substrate 1 comprising the same PPTA film as in Example 1 was used, and a molybdenum layer of 2.0 μm thickness was formed as a reinforcing layer 6 on the back surface of the substrate 1 by a sputtering method using a molybdenum target. A solar cell having a laminate structure as shown in FIG. 2 was manufactured by the same method as in Example 5 except for the modification described above.

The conversion efficiency of the solar cell was 10% when measured by a solar simulator (AM 1.5, 100 $mW/cm^2$). Further, when the laminated state of the solar cell was observed by scanning electron microscopy, peeling of the $CuInS_2$ layer from the molybdenum electrode layer was observed slightly, but peeling of the molybdenum electrode layer from the PPTA film substrate was not observed.

EXAMPLE 10

A substrate 1 comprising the same PPTA film as in Example 1 was used, and a molybdenum layer of 2.0 μm thickness was formed as a reinforcing layer 6 using a molybdenum target on the back surface of the substrate 1 by a sputtering method using a molybdenum target. A solar cell having a laminate structure as shown in FIG. 3 was manufactured as by the same method as in Example 7 except for the modification described above.

The conversion efficiency of the solar cell was 11% when measured by a solar simulator (AM 1.5, 100 mW/cm$^2$). Further, when the laminated state of the solar cell was observed by scanning electron microscopy, peeling between the CuInS$_2$ layer and the molybdenum electrode layer was not observed, and peeling of the molybdenum electrode layer from the PPTA substrate was neither observed.

The results are shown in Table 2.

From the results shown in Table 2, when Example 2 and Comparative Example 1 which are different only with respect to the material for the substrate are compared, it can be seen that since a PPTA (polyparaphenylene terephthalamide) film having a linear expansion coefficient (average value in the range of 30° C. to 300° C.) of 5.0×10$^{-6}$/° C. is used as the substrate, peeling of the semiconductor layer of the chalcopyrite structure from the molybdenum electrode layer is suppressed more to improve the conversion efficiency of the solar cell in Example 2 compared with Comparative Example 1 using a polyimide film having a linear expansion efficient of 21×10$^{-6}$/° C. as a substrate.

Further, from comparison between Example 1 and Example 2, between Example 3 and Example 4, and between Example 5 and Example 6, which are different only with respect to the provision of the reinforcing layer 6 although an identical semiconductor layer of the chalcopyrite structure is disposed on an identical PPTA film, it can be seen that peeling of the semiconductor layer of the chalcopyrite structure from the molybdenum electrode layer is suppressed by the presence of the reinforcing layer 6 to improve the conversion efficiency of the solar cell. Further, it can be seen from comparison between Example 5 and Example 7 that peeling of CuInS$_2$ layer of the molybdenum electrode layer is no more caused due to the presence of the bonding layer 7 to further improve the conversion efficiency of the solar cell.

Further, it can be seen from comparison between Example 1 and Example 8, comparison between Example 5 and Example 9 and comparison between Example 7 and Example 10, that the same effect can be obtained whether the material for the reinforcing layer 6 is titanium or molybdenum.

Further, it can be seen from comparison between Example 3 and Example 5 and comparison between Example 4 and Example 6 that when CuInS$_2$ containing Sn and P is used as the light absorption layer, the conversion efficiency is increased more than the case of using CuInS$_2$ not containing Sn and P as the light absorption layer.

In this embodiment, while only an example of using a polyparaphenylene terephthalamide which is a para-orientation type aromatic polyamide as a substrate is mentioned as an example of a solar cell in which a reinforcing layer is disposed to the back surface of a substrate comprising a flexible film, the invention is not restricted only thereto but a solar cell in which a reinforcing layer is disposed to a back surface of a substrate such as a polyimide film is also included in the present invention.

An example will be described below.

A solar cell of a laminate structure shown in FIG. 2 formed by using a polyimide film of 50 μm thickness having a modulus of elasticity of 400 kg/mm$^2$, a strength of 23 kg/mm$^2$, an elongation at break of 61.5% and a linear expansion coefficient of 21×10$^{-6}$/° C. as a substrate and formed by the same method as in Example 1 was observed by scanning electron microscopy, peeling of the molybdenum electrode layer from the polyimide film substrate and peeling of the CuInSe$_2$ layer from the molybdenum electrode layer were observed. It is consumed that since the linear expansion coefficient of the polyimide film is much greater than that of CuInSe$_2$, sufficient effect due to the provision of the reinforcing layer 6 can not be obtained. However, it was confirmed that the degree of peeling in this solar cell was smaller compared with a solar cell having a laminate structure shown in FIG. 1 with no reinforcing layer 6 and using the same polyimide film as the substrate (Comparative Example 1).

TABLE 1

| | linear expansion coefficient (× 10$^{-6}$/° C.) |
|---|---|
| MO | 5.3 |
| Ta | 6.8 |
| Co | 6.5 |
| Ti | 9.9 |
| Ni | 15.3 |

TABLE 2

| | Material for substrate | Semiconductor layer | Reinforcing layer | Bonding layer | Conversion efficiency |
|---|---|---|---|---|---|
| Example 1 | Poly paraphenylene terephthalamide | CuInSe$_2$ | Thin layer of Titanium | None | 12% |
| Example 8 | | | Thin layer of Molybdenum | None | 12% |
| Example 2 | | | None | None | 10% |
| Comparative Example 1 | Polyimide | | None | None | 6% |
| Example 3 | Poly paraphenylene terephthalamide | CuInS$_2$ | Thin layer of Titanium | None | 7% |
| Example 4 | | | None | None | 4% |
| Example 5 | | Sn + P + CuInS$_2$ | Thin layer of Titanium | None | 10% |
| Example 9 | | | Thin layer of Molybdenum | None | 10% |
| Example 6 | | | None | None | 7% |
| Example 7 | | | Thin layer of Titanium | Thin layer of Chromium | 11% |
| Example 10 | | | Thin layer of Molybdenum | Thin layer of Chromium | 11% |

INDUSTRIAL APPLICABILITY

As has been described above, since the flexible film having a predetermined linear expansion coefficient is used as the substrate, the solar cell according to the present invention causes less peeling or break-down to the semiconductor layer of the chalcopyrite structure upon fabrication of the solar cell formed into a film-like shape to a predetermined shape or during use thereof as the solar cell. As a result, a solar cell having a high conversion efficiency, reduced in the weight and having a high degree of freedom for the shape can be obtained. Further, since peeling or break-down in the semiconductor layer of the chalcopyrite structure is further suppressed by disposing the reinforcing layer to the back surface of the flexible film substrate, a solar cell having a higher conversion efficiency, reduced in weight and having high degree of freedom for the shape can be obtained.

Further, according to the method of the present invention, since the flexible film as the substrate causes less warp upon heat treatment in the step of forming the semiconductor layer of the chalcopyrite structure, peeling or partial breakdown to the semiconductor layer of the chalcopyrite structure can be prevented upon manufacture of the solar cell. This can provide a solar cell having a high conversion efficiency reduced in weight and having a high degree of freedom for the shape. Further, since the yield upon manufacture is improved, the production cost can be suppressed.

What is claimed is:

1. A solar cell having a semiconductor layer of a chalcopyrite structure as a light absorption layer on the front surface of a substrate comprising a flexible film, which has a thin film at a thickness of from 0.5 times to 5 times the thickness of the semiconductor layer of the chalcopyrite structure, having an average value of a linear expansion coefficient in the range of 30° C. to 300° C. of from $3\times10^{-6}/°$ C. to $20\times10^{-6}/°$ C., having a high corrosion resistance to an atmosphere of hydrogen selenide or an atmosphere of hydrogen sulfide, and formed to a substrate before the formation of the semiconductor layer of the chalcopyrite structure, as a reinforcing layer on the back surface of the substrate.

2. A solar cell as defined in claim 1, wherein the reinforcing layer is a thin film of Ta, Ti, Mo, Ni or Co, or a mixed composition containing at least one of said elements.

3. A solar cell as defined in claim 2, wherein a thin film of Te, Sn, Ti, Ta or Cr, or a mixed composition containing at least one of said elements is disposed between an electrode layer formed on the front surface of the substrate and the semiconductor layer of the chalcopyrite structure.

4. A solar cell as defined in claim 1, wherein the flexible film has an average value of a linear expansion coefficient in the range of 30° C. to 300° C. of from $1\times10^{-6}/°$ C. to $10\times10^{-6}/°$ C.

5. A solar cell as defined in claim 1, wherein the flexible film has a tensile strength of from 20 kg/mm² to 80 kg/mm², a modulus of elasticity in an optional direction in parallel with the film surface of from 1000 kg/mm² to 2500 kg/mm², and an elongation at break in an optional direction in parallel with the film surface of 5% or more.

6. A solar cell as defined in claim 1, wherein the flexible film as the substrate is an aromatic polyamide film.

7. A solar cell as defined in claim 6, wherein the aromatic polyamide film comprises a para-orientation type aromatic polyamide.

8. A solar cell as defined in claim 7, wherein the aromatic polyamide film comprises poly(paraphenylene terephthalamide), chloro-substituted poly(paraphenylene terephthalamide), a copolymer containing 70 mol %, more of chloro-substituted poly(paraphenylene terephthalamide) or a blend polymer containing 70 mol % or more of chloro-substituted poly(paraphenylene terephthalamide).

9. A solar cell as defined in claim 1, wherein the semiconductor layer of the chalcopyrite structure is a p-type semiconductor layer containing p-type impurities and n-type impurities.

10. A solar cell as defined in claim 9, wherein the p-type impurity is an element belonging to the group IIa and/or the group Vb, and the n-type impurity is an element belonging to the group IVb and/or the group VIIb.

11. A method of manufacturing a solar cell as defined in any one of claims 1 to 10, wherein the step of forming the semiconductor layer of the chalcopyrite structure on the front surface of the substrate comprising the flexible film is conducted after the step of forming the reinforcing layer on the back surface of the substrate.

\* \* \* \* \*